(12) United States Patent
Hack et al.

(10) Patent No.: US 11,502,263 B2
(45) Date of Patent: Nov. 15, 2022

(54) WEARABLE OLED ILLUMINATION DEVICE

(71) Applicant: Universal Display Corporation, Ewing, NJ (US)

(72) Inventors: Michael Hack, Carmel, CA (US); Michael S. Weaver, Princeton, NJ (US); Julia J. Brown, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 16/996,944

(22) Filed: Aug. 19, 2020

(65) Prior Publication Data

US 2020/0388785 A1 Dec. 10, 2020

Related U.S. Application Data

(63) Continuation of application No. 16/575,444, filed on Sep. 19, 2019, now Pat. No. 10,879,487.

(60) Provisional application No. 62/741,201, filed on Oct. 4, 2018.

(51) Int. Cl.
| | |
|---|---|
| H01L 27/32 | (2006.01) |
| G09G 3/3208 | (2016.01) |
| H01L 51/00 | (2006.01) |
| H01L 51/52 | (2006.01) |

(52) U.S. Cl.
CPC ...... *H01L 51/0097* (2013.01); *H01L 27/3241* (2013.01); *H01L 51/529* (2013.01); *H01L 51/5237* (2013.01); *H01L 51/5262* (2013.01); *G09G 2380/02* (2013.01)

(58) Field of Classification Search
CPC ......... G09G 2320/064; G09G 2354/00; G09G 2330/045; G09G 2334/00; G09G 2360/145; H01L 27/3237
See application file for complete search history.

(56) References Cited

U.S. PATENT DOCUMENTS

| | | |
|---|---|---|
| 4,769,292 A | 9/1988 | Tang |
| 5,247,190 A | 9/1993 | Friend |
| 5,703,436 A | 12/1997 | Forrest |
| 5,707,745 A | 1/1998 | Forrest |
| 5,834,893 A | 11/1998 | Bulovic |

(Continued)

FOREIGN PATENT DOCUMENTS

| | | |
|---|---|---|
| WO | 2008057394 A1 | 5/2008 |
| WO | 2010011390 A2 | 1/2010 |

OTHER PUBLICATIONS

Baldo et al. Highly efficient phosphorescent emission from organic electroluminescent devices, Nature, vol. 395, pp. 151-154, 1998.

(Continued)

*Primary Examiner* — Caridad Everhart
(74) *Attorney, Agent, or Firm* — Butzel Long

(57) ABSTRACT

Embodiments of the disclosed subject matter may provide a wearable device that includes an organic light emitting diode (OLED) light source to output light. At least one emissive layer of the OLED light source of the wearable device may have a plurality of segments that are independently controllable to output the light at a duty cycle of less than 100%. The OLED light source of the wearable device may be encapsulated.

21 Claims, 3 Drawing Sheets

(56) References Cited

U.S. PATENT DOCUMENTS

| | | | |
|---|---|---|---|
| 5,844,363 A | 12/1998 | Gu | |
| 6,013,982 A | 1/2000 | Thompson | |
| 6,087,196 A | 7/2000 | Sturm | |
| 6,091,195 A | 7/2000 | Forrest | |
| 6,097,147 A | 8/2000 | Baldo | |
| 6,294,398 B1 | 9/2001 | Kim | |
| 6,303,238 B1 | 10/2001 | Thompson | |
| 6,337,102 B1 | 1/2002 | Forrest | |
| 6,468,819 B1 | 10/2002 | Kim | |
| 7,279,704 B2 | 10/2007 | Walters | |
| 7,431,968 B1 | 10/2008 | Shtein | |
| 7,968,146 B2 | 6/2011 | Wagner | |
| 2003/0230980 A1 | 12/2003 | Forrest | |
| 2004/0174116 A1 | 9/2004 | Lu | |
| 2009/0152445 A1* | 6/2009 | Gardner, Jr. | G06F 3/041 250/2 UAL |
| 2012/0187295 A1* | 7/2012 | So | H01L 51/5096 250/340 |
| 2013/0280671 A1 | 10/2013 | Brawn | |
| 2014/0035960 A1* | 2/2014 | You | G09G 3/3413 345/690 |
| 2015/0375008 A1* | 12/2015 | Gretz | A61N 5/0618 607/90 |
| 2016/0028036 A1* | 1/2016 | Xue | H01L 51/5036 257/40 |
| 2016/0351104 A1* | 12/2016 | Yaras | G09G 3/2022 |
| 2017/0229663 A1 | 8/2017 | Tsai | |
| 2019/0083202 A1* | 3/2019 | Brawn | A61C 8/0006 |
| 2020/0235317 A1 | 7/2020 | Bender | |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

* cited by examiner

WEARABLE OLED ILLUMINATION DEVICE

CROSS-REFERENCE TO RELATED APPLICATIONS

This application claims priority to U.S. patent application Ser. No. 62/741,201, filed Oct. 4, 2018, and is a continuation of U.S. patent application Ser. No. 16/575,444 filed on Sep. 19, 2019, the entire contents of both are incorporated herein by reference.

FIELD

The present invention relates to wearable OLED (organic light emitting diode) lighting devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to an embodiment, a wearable device may include an organic light emitting diode (OLED) light source to output light. At least one emissive layer of the OLED light source may have a plurality of segments that are independently controllable to output the light at a duty cycle of less than 100%, with a periodicity from 1 second to 10 microseconds. The OLED light source of the OLED device may be encapsulated.

The plurality of segments of the wearable device may have the same emissive layer of the OLED light source, or may have different emissive layers of the OLED light source.

The OLED light source may include a microcavity to output the light. The light output by the OLED light source may be less than 20 nm full width at half maximum (FWHM). The light output by the OLED light source may be 0-250 mW/cm$^2$.

The wearable device may include an outcoupling layer coupled to, or integrated within, the OLED light source. The outcoupling layer may be an internal light extraction layer or an external extraction layer.

One or more of the plurality of segments of the wearable device may be spaced apart from one another. The plurality of segments of the wearable device may be independently controllable so that the duty cycle is less than 50%.

At least one of the plurality of segments of the wearable device may output the light at a different time than the other segments. The output of light by the plurality of segments may be less than 50% of the plurality of segments output light at the same time, or less than 25% of the segments output light at the same time.

The OLED light source of the wearable device may be disposed on a flexible substrate. The flexible substrate may be without glass. The flexible substrate may be a metal substrate to reflect light in the microcavity and to dissipate heat generated by the OLED light source.

The wearable device may include at least one thermally conductive layer to uniformly dissipate heat generated by the OLED light source. The wearable device may include a fan, and/or at least one fin disposed on the encapsulation to dissipate heat generated by the OLED light source.

The wearable device may include one or more sensors to detect heat and/or light output by the OLED light source. A processor may be communicatively coupled to the one or more sensors to control the OLED light source based on the detection of at least one of the heat and the light by the one or more sensors.

The OLED light source of the wearable device may have a plurality of emitters to emit light having different peak wavelengths of light. The OLED light source may include at least one down-conversion layer to downconvert light from at least one emissive layer of the OLED light source.

The wearable device may include a diffuser disposed over the OLED light source to homogenize light from at least one of the plurality of segments.

The wearable device may include a patterned substrate to change an optical path length of at least one of the plurality of segments.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
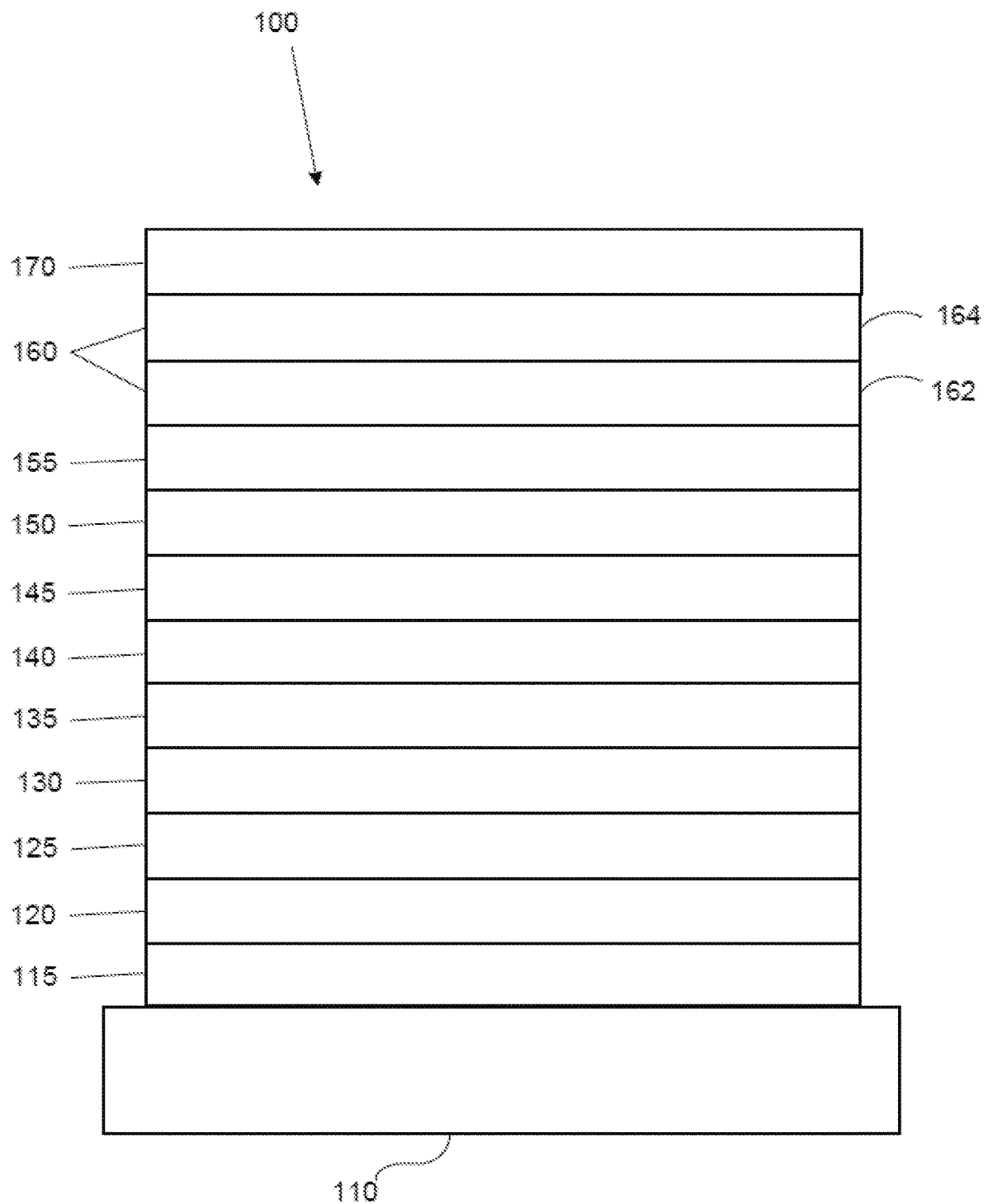
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
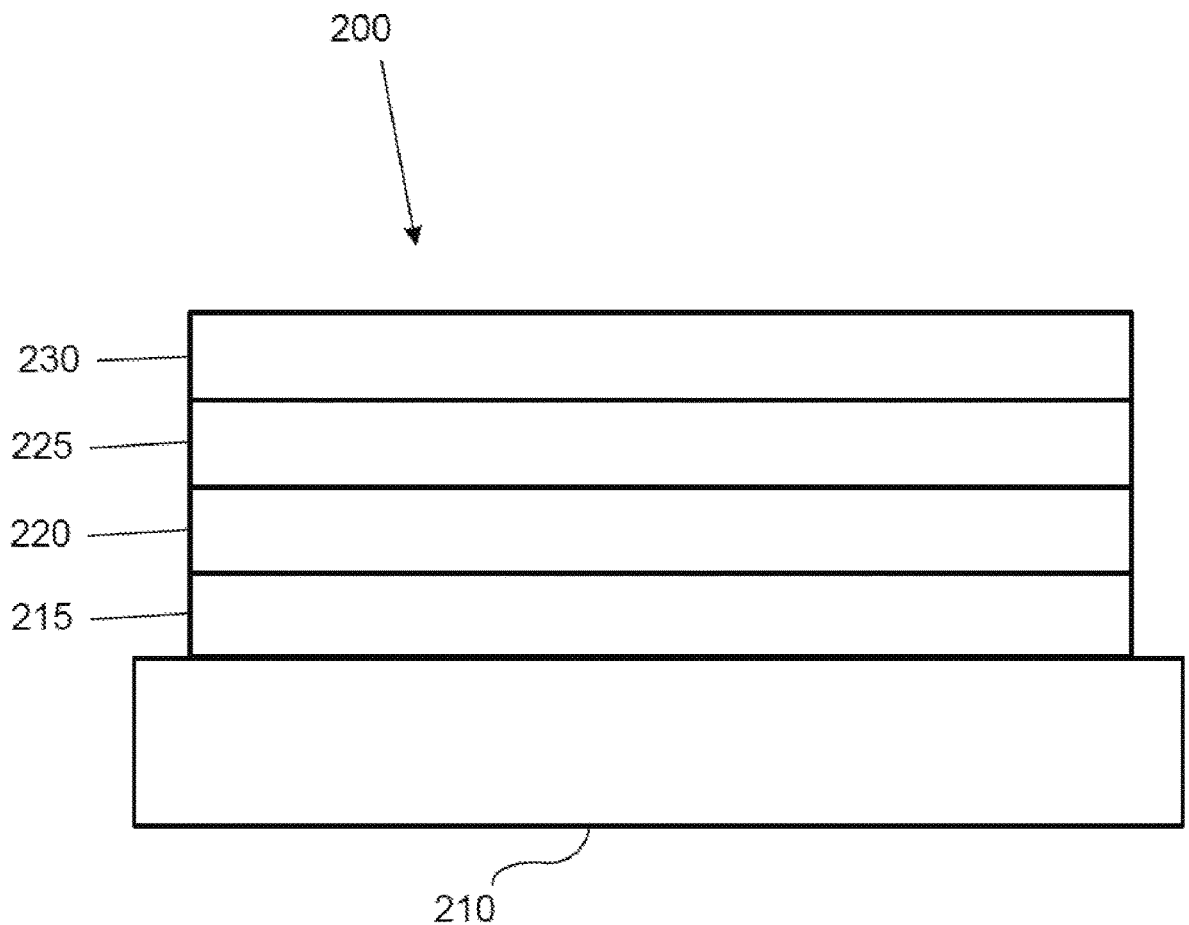
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light, which may be altered by another layer such as a color filter or other color altering layer that does not itself emit an initial light within the device, but may re-emit altered light of a different spectra content based upon initial light emitted by the emissive layer.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVID. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, microdisplays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination With Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

OLED light sources, as described throughout, may provide source of illumination for wearable OLED device therapy patches for a plurality of photomedicine applications. Some photomedicine applications use narrow spectra (e.g. <20 nm FWHM spectra) at high intensity (e.g. 20,000 $cd/m^2$) at a specific wavelength of light, whereas other applications such as photobiomodulation use relative broad emission spectra (>50 nm FWHM). OLEDs may be used to provide flexible wearable light sources that may conform to the human body. The OLED devices disclosed herein may provide light doses without the need for a patient to go to a specific facility and be irradiated by laser or other bulky light sources. OLEDs may be used to provide large area, flexible light sources for such wearable devices. Conventional OLEDs arrangements may not be suitable for such photomedicine applications because they typically have too wide a spectrum and may not produce a predetermined intensity level, or produce too much heat to be worn next to the human body For example, if a conventional OLED device were to produce 20,000 $cd/m^2$ operating at 20 cd/A and 5V, the input power would be 500 $mW/cm^2$. This may not be suitable for a wearable device, as it would lead to temperatures in excess of 50° C.

In embodiments of the disclosed subject matter, OLED devices may produce the desirable spectral characteristics (e.g. less than 20 nm full width at half maximum (FWHM)) at high luminance (e.g. 20,000 $cd/m^2$) without producing too much heat such that the wearable OLED device may not be uncomfortable to wear. That is, the OLED device may be wearable, as it provides predetermined output light levels for photomedicine with reduced heat output so as to avoid discomfort of the wearer. Specifically, OLED devices as disclosed herein may be operated for a variety of photomedicine applications without exceeding a temperature of 50° C. or a temperature rise of more than 25° C.

Embodiments of the disclosed subject matter provide a wearable OLED light source to provide light for photomedicine applications. The OLED may be encapsulated by one or more thin films. The one or more encapsulation layers may be flexible so as to have a radius of curvature of about 5 cm, and that the OLED light source remains functional when the one or more encapsulation layers are flexed. In some embodiments, the OLED may be placed within fabric to make it comfortable. The wearable OLED device may provide light for hours without inconveniencing and/or causing discomfort to the patient.

Figure 3:
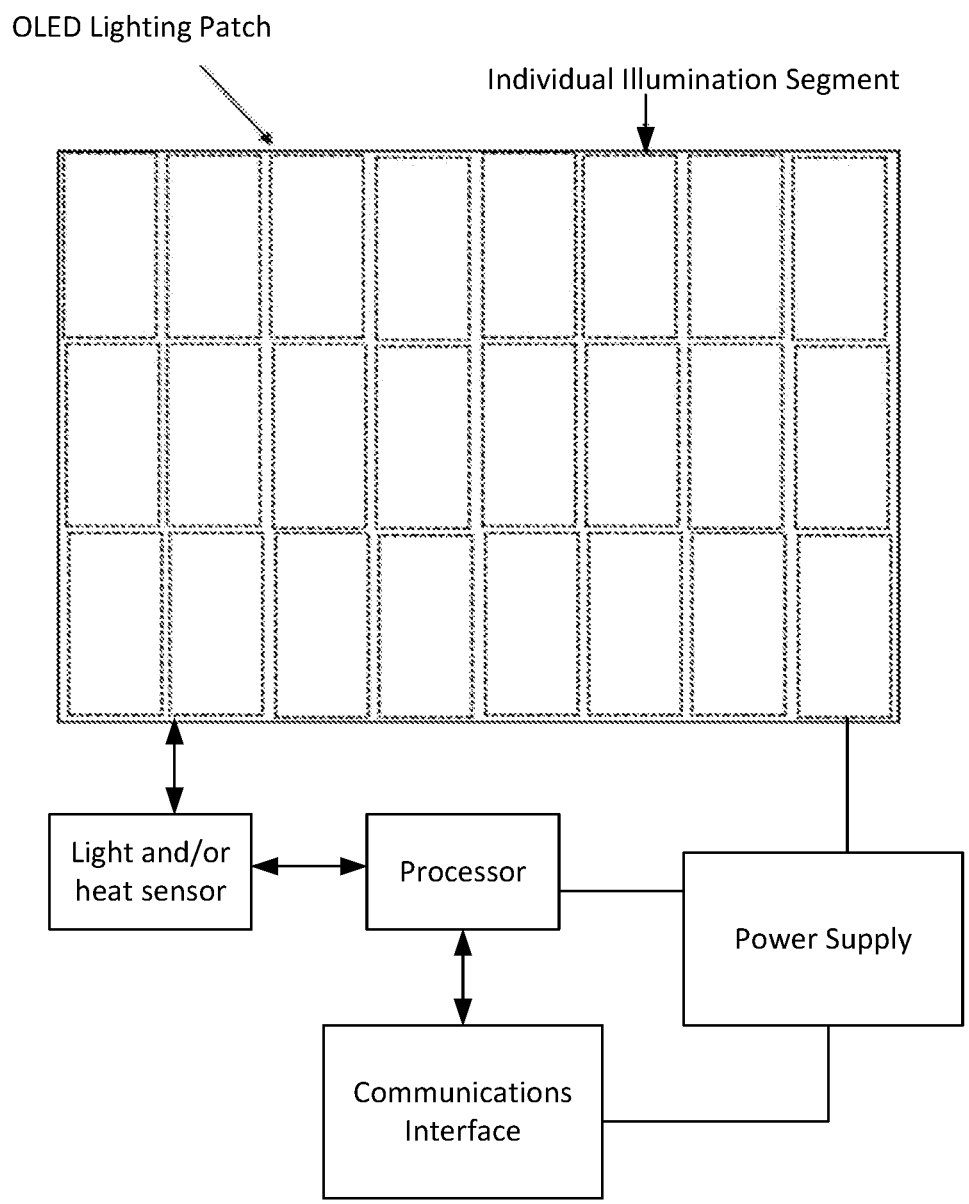
FIG. 3 shows an example of a wearable segmented OLED lighting device according to an embodiment of the disclosed subject matter.

According to embodiments of the disclosed subject matter, a wearable device may include an organic light emitting diode (OLED) light source to output light, which may include the structures shown in FIGS. 1 and 2. As shown in FIG. 3 and discussed below, at least one emissive layer of the OLED light source may have a plurality of segments that are independently controllable to output the light at a duty cycle of less than 100%. This implies that the time average output of the device may be less than that would be provided if all the area of the device was illuminated continuously. So at any given time, some segments may be illuminated and others not, and which segments are illuminated may change over time. Each segment would be illuminated with less than 100% duty cycle, with a periodicity from 1 second to 10 microseconds. The OLED light source of the OLED device may be encapsulated.

Embodiments of the disclosed subject matter may include an OLED that includes a microcavity OLED stack. As it may be desirable for photomedicine applications to use narrow line shapes (e.g. less than 20 nm FWHM), a microcavity may be used to produce these narrow line widths. A microcavity may focus the light emission into a direction normal to the substrate, which may provide increased optical efficiency to the wearable OLED device. This may reduce input power for the OLED light source, and may reduce the amount of heat that is generated. That is, an OLED light source of the wearable OLED device may include a microcavity to output the light. The light output by the OLED light source may be less than 20 nm full width at half maximum (FWHM), and may be 0-250 mW/cm$^2$ of optical output power. For the purposes of this application, the optical output "light" may be visible light (e.g., 400-700 nm), or the optical output light may extend into the near infra-red, for example, from 800-1100 nm output.

In some embodiments, the wearable device may include an outcoupling layer coupled to, or integrated within, the OLED light source. The outcoupling layer may be an internal light extraction layer or an external extraction layer. The outcoupling layer may be used to increase the light output. This may lower the power used by the OLED light source, which may reduce and/or minimize the heat output from the OLED light source. Internal light extraction and/or external light extraction films may be incorporated into the OLED light source to maximize light output.

A wearable OLED device may have a predetermined area (e.g., 5 cm×5 cm) as a single pixel. In some embodiments of the disclosed subject matter, the wearable OLED device may include a plurality of segments which may be individually addressed, such as shown in FIG. 3. The plurality of segments of the wearable device may have the same emissive layer of the OLED light source, or may have different emissive layers of the OLED light source.

As illuminating the whole wearable OLED device (e.g., at high luminance) at a given time may produce too much heat, embodiments of the disclosed subject matter may drive one or more segments at the same time. The segments that may be driven at the same time may be spaced apart from each other, so that heat from each illuminated area may flow to non-energized regions of the wearable OLED device to promote cooling.

The plurality of segments of the wearable device may be independently controllable so that the duty cycle is less than 50%. For example, if one third of the plurality of segments of the OLED light source are illuminated (i.e., energized) at any given time, then the wearable device may receive one third the heat, thus lowering the operational temperature of the wearable OLED device. In some embodiments, the amount of time the wearable OLED device is active may be increased, so that all of the segments would be illuminated over time to provide the desired dosage of light.

At least one of the plurality of segments of the wearable device may output the light at a different time than the other segments. The output of light by the plurality of segments may be less than 50% of the plurality of segments output light at the same time, or less than 25% of the segments output light at the same time.

For example, if the wearable OLED device is to provide one hour of light exposure to produce a predetermined light dosage, then one third of the segments of the OLED light source may be energized for an hour. This may be repeated for an hour for a second set of segments of the OLED light source for another one third of the display, and repeated for the final set of segments of the OLED light source. Alternatively, each set of segments of the OLED light source for one third of the wearable OLED device may be energized for one or more minutes, and then the same for the second set and third set of segments of the OLED light source. This sequence may be repeated until all of the segments of the OLED light source have been illuminated for the predetermined dosage.

In some embodiments, the power used and the heat dissipated by the wearable OLED device may be reduced and/or minimized by pulsing the OLED light source. For example, if target molecules for the photomedicine application have a response time of about 10 ms, one or more segments of the OLED light source may be pulsed using a 50% duty cycle with a 10 ms period. This may maintain the effectiveness of the light, and the input power and heat used by the OLED light source of the wearable OLED device may be halved.

The OLED light source may be disposed on thin flexible glass or plastic. In embodiments of the disclosed subject matter, the OLED light source of the wearable device may be disposed on a flexible substrate. In some embodiments, the substrate may be flexible so as to have a radius of curvature of about 5 cm, and that the OLED light source remains functional when the substrate is flexed.

The flexible substrate may be without glass, as glass may break when flexed and/or when a user bumps or makes contact with a surface while wearing the wearable OLED device. The flexible substrate may be a metal substrate to reflect light in the microcavity and/or to dissipate heat generated by the OLED light source. The metal may act as a thermal conductor such that when one or more segments of the light source are energized at a given time, the heat may flow uniformly across the OLED light source and the wearable OLED device, thus lowering the overall temperature.

In some embodiments of the disclosed subject matter, one or more thermally conducting layers (e.g., graphene layers) may be included with the wearable OLED device to spread out and/or dissipate heat generated by the OLED light source. One side (i.e., a backside) of the wearable OLED device (i.e., a side that is opposite to a side of a surface of the wearable OLED device that contacts the skin) may have a fan, and/or fins disposed on the surface of the backside. This may increase the backside surface area to increase dissipation of heat generated by the OLED light source away from the surface of the skin.

In some embodiments of the disclosed subject matter, the wearable OLED device may include a microcavity, which may increase efficiency about 1.5 times, an outcoupling film that may provide an increase of efficiency of about 2 times, and/or segmentation of the OLED light source, which may reduce steady-state power by about 4 times. The combination of these elements may reduce power consumption by about 12 times. This may reduce the initial heat from 500 mW/cm$^2$ to 40 mW/cm$^2$, which may not be uncomfortable for a wearable OLED device. In some embodiments, the device may be configured such that it cannot produce heat above a selected threshold, of approximately 50 mW/cm$^2$. For example, the device may be programmed and/or configured via fixed electrical wiring to output no more than 40, 50, 100, 200, 250, or 300 mW/cm$^2$. Some embodiments may achieve this limiting effect by requiring various limited duty cycles between one or more segments of the OLED panels in the device, as described herein. For example, the wearable OLED device may be configured to require no more than a maximum duty cycle for one or more of the segments, while still allowing the total light output to be provided at a desired level for any given segment while it is illuminated, as disclosed herein.

In embodiments of the disclosed subject matter, the wearable OLED device may include a power supply (e.g., battery), one or more sensors, and a processor, such as shown in FIG. 3. The one or more sensors may monitor light output by the OLED light source, and the processor may determine the correct light dosage based on the monitored light output. The one or more sensors may monitor the heat dissipated by the operation of the OLED light source to determine whether the wearable OLED device may be uncomfortable for a user.

A processor, as shown in FIG. 3, may be communicatively coupled to the one or more sensors to control the OLED light source based on the detection of at least one of the heat and the light by the one or more sensors. The processor may adjust the amount and/or duty cycle of the light output by the OLED light source to reduce a temperature. That is, OLED light source may be controlled based on measurements made using the temperature sensors. The processor may be used to control and/or reduce luminance of the OLED light source, and extend application times to deliver a predetermined light dosage while avoiding temperatures that exceed a predetermine amount.

As shown in FIG. 3, the wearable device may include a wired and/or wireless communications interface. The communications interface may be communicatively coupled to the processor so that the wearable OLED device may be remotely controlled via control signals received via the communications interface.

Different therapies may use different wavelengths of light. In implementations of the disclosed subject matter, the OLED light source of the wearable device may have a plurality of emitters to emit light having different peak wavelengths of light. The OLED light source may include at least one down-conversion layer to downconvert light from at least one emissive layer of the OLED light source. The plurality of emitter may activate one or more drugs for therapeutic applications, and/or provide a wearable OLED device that may activate one or more drugs (e.g., lower cost drugs). The processor may be programmed to emit light from a specific emitter for an individual patient, depending on the therapeutic drug taken by the patient.

In embodiments of the disclosed subject matter, the OLED light sources may be formed in a similar manner to OLED displays, where different emitters may be deposited or patterned in different regions of the display (e.g., by using organic vapor jet printing (OVJP) or a shadow mask).

Emitters of the same color may be energized at the same time to provide broad area illumination of a single spectrum. In some embodiments of the disclosed subject matter, a diffuser may be placed over the OLED light source to homogenize the light from a specific emitter so the light from one sub-pixel (per pixel) may provide uniform illumination over the segment of the OLED light source being energized.

In an embodiment of the disclosed subject matter, the same emitter may be used, and the substrate may be patterned using lithography. The patterned substrate may change an optical path length of at least one of the plurality of segments and/or subpixels. This may reduce the manufacturing complexity and/or cost of the OLED light source for the wearable device. That is, broad area lithography may be used to pattern the pixel color, which may be less expensive and/or less complex that the use of multiple emitters and an emissive layer patterning process.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A wearable device comprising:
an organic light emitting diode (OLED) light source to output light at 0-250 mW/cm$^2$ with a luminance of 0-20,000 cd/m$^2$, such that when the OLED is operating at a maximum output, a temperature rise of the wearable device is less than 25° C.,
wherein at least one emissive layer of the OLED light source has a plurality of segments that are independently controllable to output the light,
wherein the plurality of segments have the same emissive layer of the OLED light source, and
wherein the OLED light source is encapsulated.

2. The wearable device of claim 1, wherein each of the plurality of segments of the OLED light source emits light continuously over the respective segment.

3. The wearable device of claim 2, wherein each of the plurality of segments has an area of at least 5 cm×5 cm.

4. The wearable device of claim 2, wherein each of the plurality of segments has an area of at least 1 cm×1 cm.

5. The wearable device of claim 1, wherein the light output by the OLED light source is less than 20 nm full width at half maximum (FWHM).

6. The wearable device of claim 1, wherein the light output by the OLED light source is selected from the group consisting of: greater than 30 nm full width at half maximum (FWHM), greater than 40 nm FWHM, and greater than 50 nm FWHM.

7. The wearable device of claim 1, wherein one or more of the plurality of segments are spaced apart from one another.

8. The wearable device of claim 1, wherein the OLED light source has a plurality of emitters to emit light having different peak wavelengths of light.

9. The wearable device of claim 1, wherein the OLED light source includes at least one down-conversion layer to downconvert light from at least one emissive layer of the OLED light source.

10. The wearable device of claim 1, wherein the at least one emissive layer of the OLED light source comprises quantum dots.

11. A wearable device comprising:
an organic light emitting diode (OLED) light source to output light at 0-250 mW/cm$^2$ with a luminance of 0-20,000 cd/m$^2$, such that when the OLED is operating at a maximum output, a temperature rise of the wearable device is less than 25° C., wherein at least one emissive layer of the OLED light source has a plurality of segments that are independently controllable to output the light,
wherein the plurality of segments have different emissive layers of the OLED light source, and
wherein the OLED light source is encapsulated.

12. The wearable device of claim 11, wherein each of the plurality of segments of the OLED light source emits light continuously over the respective segment.

13. The wearable device of claim 12, wherein each of the plurality of segments has an area of at least 5 cm×5 cm.

14. The wearable device of claim 12, wherein each of the plurality of segments has an area of at least 1 cm×1 cm.

15. The wearable device of claim 11, wherein the light output by the OLED light source is less than 20 nm full width at half maximum (FWHM).

16. The wearable device of claim 11, wherein the light output by the OLED light source is selected from the group consisting of: greater than 30 nm full width at half maximum (FWHM), greater than 40 nm FWHM, and greater than 50 nm FWHM.

17. The wearable device of claim 11, wherein one or more of the plurality of segments are spaced apart from one another.

18. The wearable device of claim 11, wherein the OLED light source has a plurality of emitters to emit light having different peak wavelengths of light.

19. The wearable device of claim 11, wherein the OLED light source includes at least one down-conversion layer to downconvert light from at least one emissive layer of the OLED light source.

20. The wearable device of claim 11, wherein the at least one emissive layer of the OLED light source comprises quantum dots.

21. The wearable device of claim 1, wherein the light output by the OLED light source has a wavelength of 800-1100 nm.

\* \* \* \* \*